United States Patent [19]

Bohlen et al.

[11] 4,267,259

[45] May 12, 1981

[54] EXPOSURE PROCESS

[75] Inventors: Harald Bohlen, Boeblingen; Johann Greschner, Pliezhausen; Werner Külcke; Peter Nehmiz, both of Boeblingen, all of Fed. Rep. of Germany

[73] Assignee: International Business Machines Corporation, Armonk, N.Y.

[21] Appl. No.: 12,634

[22] Filed: Feb. 16, 1979

[30] Foreign Application Priority Data

Feb. 22, 1978 [DE] Fed. Rep. of Germany ....... 2807478

[51] Int. Cl.³ .................... B05D 3/06; G03F 7/26
[52] U.S. Cl. ................... 430/296; 430/270; 430/312; 430/967
[58] Field of Search .......... 427/43; 96/35.1, 36.2; 430/270, 296, 312, 967

[56] References Cited

U.S. PATENT DOCUMENTS 3,849,136 11/1974 Grebe .................. 430/270
4,165,395 8/1979 Chang .................. 427/43

OTHER PUBLICATIONS

Gunther-Mohr, "IBM Tech. Disc. Bull." vol. 21, No. 8, pp. 3176, 3177, Jan. 1979.

*Primary Examiner*—John H. Newsome
*Attorney, Agent, or Firm*—James R. McBride

[57] ABSTRACT

Radiation sensitive layers are x-ray exposed by providing a metal mask pattern on the layer through which the layer is exposed. The metal mask pattern is formed by applying a blanket metal layer to the radiation sensitive layer followed by an electron beam sensitive resist layer which is patterned by an electron beam exposure process. The exposed portions of the metal layer are then etched away to form the metal mask pattern.

10 Claims, 7 Drawing Figures

EXPOSURE PROCESS

BACKGROUND OF THE INVENTION

The invention concerns a process for x-ray exposing a radiation sensitive layer.

During the manufacture of integrated semiconductor circuits, the semiconductor wafer areas to be processed in each process step are defined by photoresist layers which are exposed in the form of the patterns desired in each case and which are subsequently developed. Increasing miniaturization has caused the maximum 2 $\mu$m resolution of the previously employed exposure processes, using radiation wavelengths ranging from 0.3 $\mu$m to 0.7 $\mu$m, to be reached and exceeded in some cases. Recently there has been a tendency to use processes in which exposure in effected by electron beams or x-rays.

However, in the case of electron beam or x-ray exposure the resolution is very high. Theoretically lines with widths of 0.1 $\mu$m and less can be transferred, but both electron beams and x-rays have a number of disadvantages which limit their use for the industrial production of integrated circuits. The essential disadvantages inherent in the use of electron beams are due to the fact that the electrons are scattered in the radiation sensitive layer. Therefore, particularly in the case of narrow structures, a considerable widening of the exposed areas occurs. This phenomenon is particularly detrimental at very small distances between the individual exposed areas, since the undesired and inaccurately defined widening may lead to contacts between adjoining structures, thus rendering the finished integrated circuits unserviceable. Only elaborately computed pattern or exposure dose variations ensure that the desired dimensions of the patterns are actually obtained after development. The fact that the value 1 cannot be exceeded for the ratio of the photoresist layer thickness to the smallest line width is also attributable to the scattering of the electrons. Because, for the etching or implantation steps following exposure and development, photoresist layers with a thickness of at least 1 $\mu$m are indispensable, the use of electron beams for submicron lithography is practically precluded.

The aforementioned disadvantages are not encountered when x-rays are used to expose photoresist layers, because during x-ray exposure the line width to the photoresist layer thickness ratio may be less than 1:10. However, x-rays cannot be bundled into a bunch of parallel rays, and the x-ray sources available generate ray cones whose solid angles are about 60°. A consequence of this is that at distances from the x-ray source at which an approximately parallel radiation is present, the intensities are so low that exposure times of many hours and even days are required. Exposure times of such length are considerably extended by the fact that there are no mask substrates which even at thicknesses of 3 $\mu$m and less pass more than 50% of the x-radiation. Because of this it is not possible during the manufacture of integrated semiconductor circuits to x-ray expose only small areas, for example, chip areas. For exposure to be relatively economical, it is necessary to utilize the full ray cone of the x-ray source, i.e., to simultaneously expose several hundred semiconductor wafers, i.e., 20,000 to 100,000 chips. The exposure of only small areas of the semiconductor wafer, e.g., areas having the size of one or several chips, which is desirable per se, is not economically acceptable because of the plurality of highly accurate alignments required and because of the poor utilization of the x-ray cone. Because of the inevitable warping of the wafer, the simultaneous x-ray exposure of a whole wafer necessitates distances between mask and wafer of at least 30 to 50 $\mu$m. The number of faulty exposures is so high in practice that the simultaneous exposure of several hundred semiconductor wafers is not possible during the industrial production of integrated semiconductor circuits with submicron structures. Although the lateral displacement of a mask image transferred by obliquely incident beams, which in the case of highly divergent beams may differ considerably from one location to another, can be compensated by suitable measures during mask manufacture, it must not be overlooked that reversible or irreversible local length changes of the masks and/or the semiconductor wafers or local alignment errors caused by local distance changes and amounting to several $\mu$m are still encountered. This shows that the previously known methods of x-ray exposure cannot be used for the large-scale industrial production of integrated semiconductor circuits with line elements in the submicron range, although during the development of x-ray exposed photoresist layers channels with perpendicular smooth walls can be generated, whose width is less than a tenth of the thickness of the photoresist layer. Alignment methods for x-ray lithography meeting the accuracy requirements of submicron lithography have not become known so far.

It is the object of the invention to provide a process for the exposure of light-sensitive layers, utilizing all the advantages of electron beam and x-ray exposure, while eliminating the disadvantages.

BRIEF SUMMARY OF THE INVENTION

In accordance with this invention there is provided a process for x-ray exposing a radiation sensitive layer, in particular during the manufacture of integrated semiconductor circuits, characterized by the following process steps:

(a) a first x-ray sensitive layer is applied to a substrate,
(b) a second superimposed metal layer layer is applied to the x-ray sensitive layer,
(c) a third superimposed electron beam sensitive layer is applied to the metal layer,
(d) the third layer is exposed by electron beam to define the areas of the first layer which are to be x-ray exposed,
(e) the exposed areas of the third layer are removed by development,
(f) the bared areas of the second layer are removed by etching, and the first layer is exposed to x-rays with the second layer serving as a mask.

By electron beam exposing the top-most thin layer, baring the metal layer arranged underneath by means of a development step, and then etching, a very finely structured mask is produced which is suitable for subsequent x-ray exposure and which is an exact image of the exposure pattern generated by the electron beams. As the top most layer may be very thin, photoresist layers of 0.3 $\mu$m and less are quite sufficient for etching the metal layer, the uncontrolled widening of the lines resulting from scattered electrons in the thick photoresist layers described above is not encountered. This applies in particular to exposure by means of low-acceleration electrons as, for example, during electron beam shadow printing with the aid of complementary masks. In addition, it is possible by means of suitable, relatively simple measures, which will be described below, to apply the metal layer only in the area of the chips to be generated. The interposed semiconductor areas, not serving to accomodate circuits are bared, by removing both photoresist layers, so that the marks applied in these areas for electron beam alignment, by means of arrangements and methods known per se, can be used for an extremely accurate automatic alignment. In this manner the electron beam exposure system can be aligned to small areas at the extremely high accuracy afforded by the use of electron beams.

The masks produced in this manner at high speed, maximum resolution and an extremely high alignment accuracy are connected to the semiconductor wafer by means of a photoresist layer. The photoresist thickness, depending upon the requirements of the subsequent process steps, is 1 3 μm which can be kept constant, save for a few percent, by means of known measures. In this manner it is possible to carry out the subsequent x-ray exposure with a relatively highly divergent group of x-rays. This means that the distances between the x-ray source be the area of the semiconductor wafer can extend at distances essentially reduced over those possible with previously known x-ray exposure processes. Because of the very small distance between the mask and semiconductor wafer, which is practically zero and, therefore, kept constant at a high degree of accuracy, it is possible to use large-area and thus highly intensive x-ray sources in place of the previously required point-shaped and thus very weak x-ray sources. In comparison with the previously known x-ray exposure processes whereby, as explained above, the distance between source and semiconductor wafer had to be as a rule 1 to 3 m, to avoid excessive divergence angles, the process in accordance with the invention has considerable advantages. As the x-ray mask, produced by electron beam exposure and subsequent development and etching from the metal layer arranged between the two photoresist layers, is permanently connected to the semiconductor wafer by means of the x-ray sensitive photoresist, problems resulting from a different lateral extension of the mask and/or the semiconductor wafer are eliminated.

Thus, the process in accordance with the invention does not only combine the advantages of the previously known electron beam and x-ray exposure processes, without being subject to their disadvantages, but additionally improves the known x-ray exposure processes in that the radiation intensities available for exposure are increased at least by a power of ten.

The invention will be described in detail below by means of the figures.

DETAILED DESCRIPTION

Figure 1:
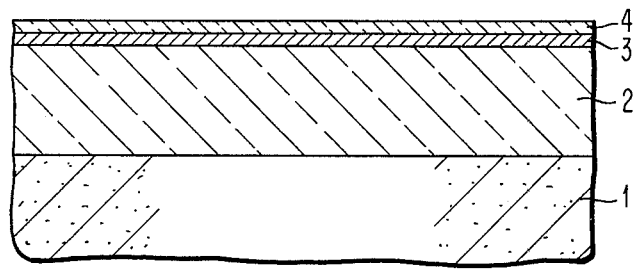
FIG. 1 is a sectional view of a semiconductor wafer coated for implementing the process in accordance with the invention.

In accordance with FIG. 1, a 1 to 3 μm thick x-ray sensitive photoresist layer 2, such as polymethyl methacrylate polymers and copolymers, whose local thickness variations range from 5% to a maximum 10%, is deposited on a semiconductor wafer 1 by processes known per se, for example, by applying a suitable quantity of photoresist and subsequent spinning. Then a heavy-metal layer 3, preferably consisting of gold and having a thickness of about 0.1 to 0.5 μm, is applied to this layer, for example by vapor deposition. The heavy-metal layer is followed by a layer 4 of about the same thickness, which consists of an electron beam sensitive photoresist, such as polymethyl methacrylate polymers or copolymers, and 1,2-quinone-diazide sulfuric acid ester sensitized phenol-formaldehyde novolak resin. Negative acting as well as positive acting resist layers could also be used as is known in the art.

Then by means of low acceleration electron beams, using processes known per se, the top-most layer 4 is exposed in the form of the patterns to be transferred to the semiconductor wafer 1 and subsequently developed, so that, as shown in FIG. 3A, the heavy-metal layer 3 is bared in the areas 5.

Subsequently, the heavy-metal layer 3 in the areas 5 is removed, for example, by dry etching, to bare the x-ray sensitive layer 2 in the areas designated as 6 in FIG. 2B. The layer 2 is then x-ray exposed through the heavy-metal layer 3, which acts as a mask at this stage, and developed. During this, as shown in the sectional view of FIG. 2C, perpendicular channels 7 are formed, whose walls, which are almost entirely planar and extend perpendicular to the surface of the semiconductor wafer 1, represent an exact image of the recesses 6 contained in the heavy-metal layer 3 serving as a mask. For the subsequent treatment of the bared areas of the semiconductor wafer 1, the residual areas of the heavy-metal layer 3 are best removed, to avoid contamination of the semiconductor wafer 1 by the heavy-metal layer 3. In other cases it may be expedient to leave the residual areas of the heavy-metal layer 3 on layer 2.

Figure 3:
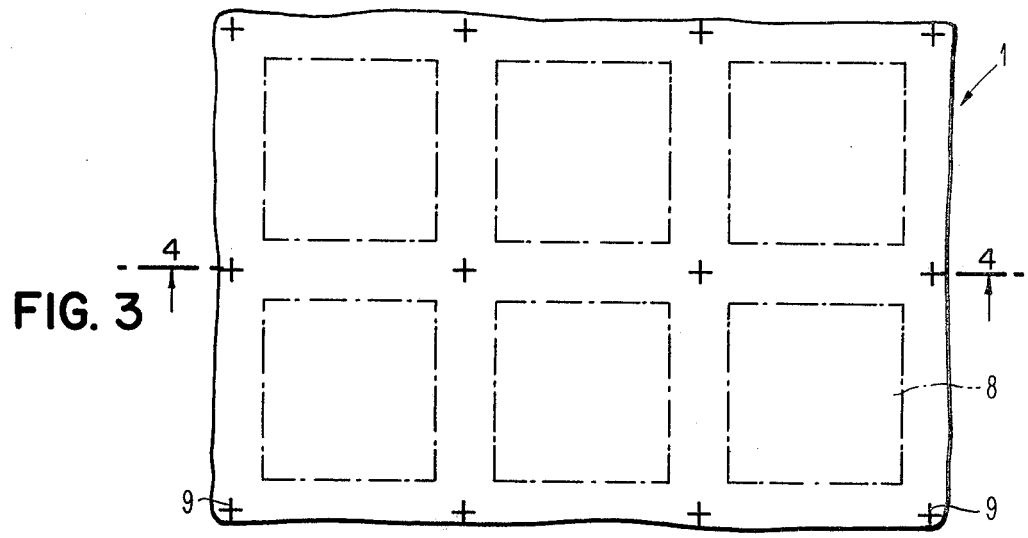
FIG. 3 is a diagrammatic representation of the distribution of the areas to be provided with integrated circuits and of the interposed semiconductor wafer areas containing alignment marks.
Figure 4:
FIG. 4 is a sectional view of FIG. 3 along line 4—4.

FIG. 3 shows the surface of a semiconductor wafer 1 with the areas (chips) 8 accommodating the operable circuits and the alignment marks 9 arranged in the interposed areas. FIG. 4 is a sectional view along line 4—4 of the semiconductor wafer shown in FIG. 3.

Figure 2:
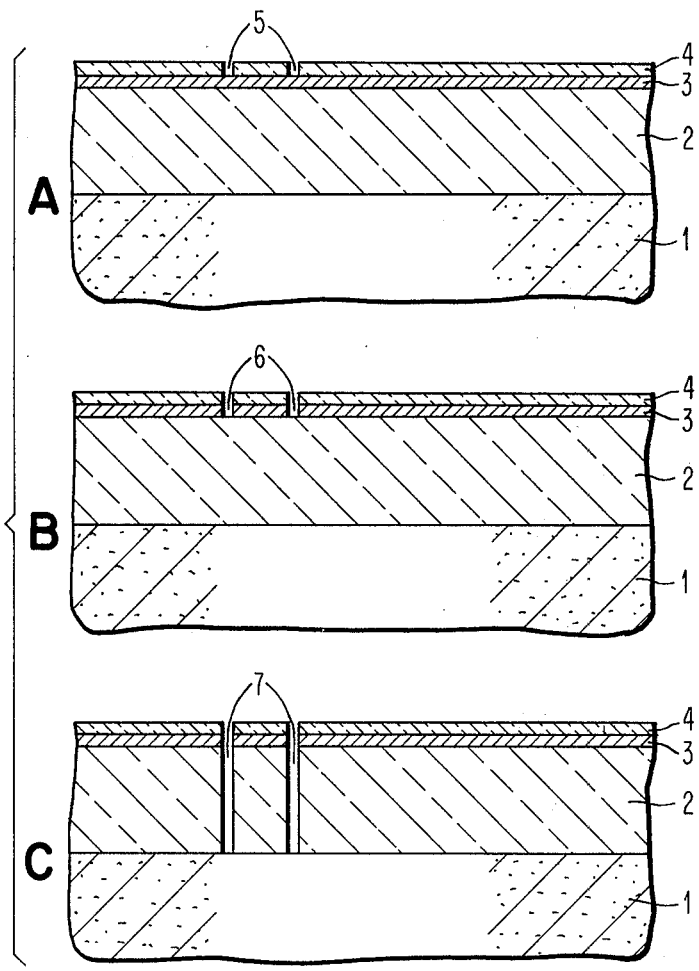
FIGS. 2A-C are sectional views illustrating the individual process steps.
Figure 5:
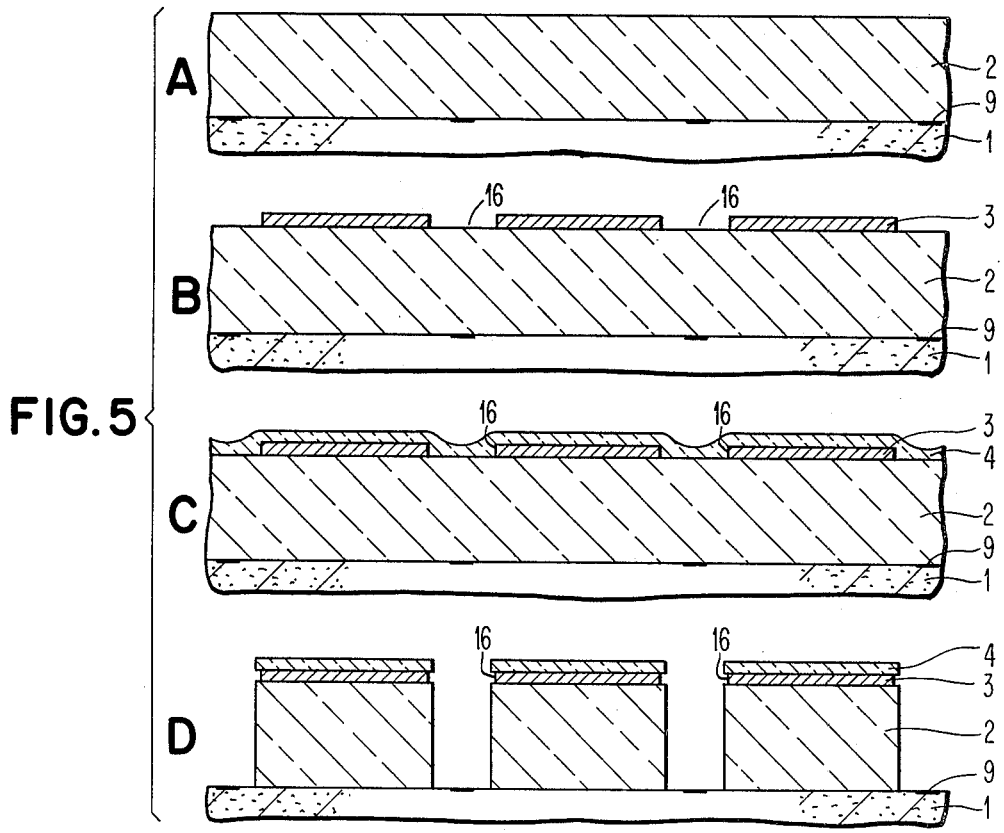
FIGS. 5A–D are sectional views illustrating a particularly advantageous further development of the process in accordance with the invention.
Figure 6:
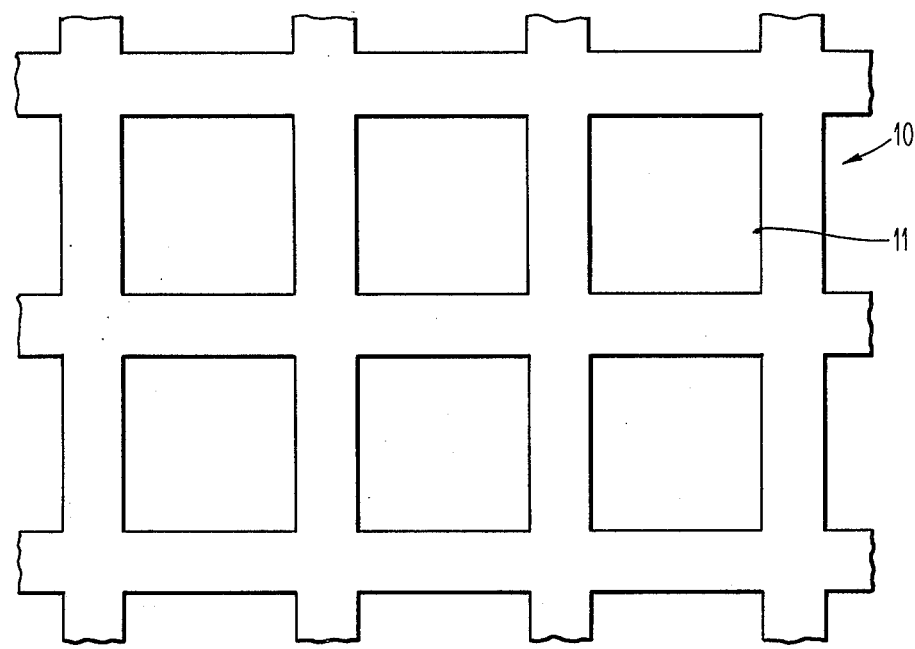
FIGS. 6 and 7 are masks for implementing the process in accordance with the invention.
Figure 7:
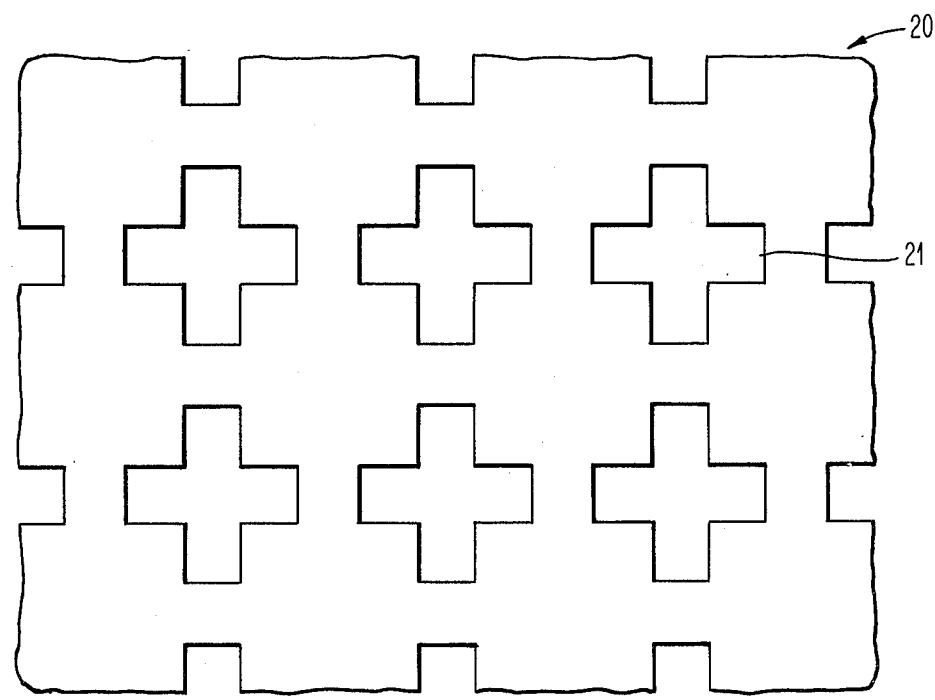

Onto the semiconductor wafer 1, prepared by the application of the alignment marks 9, the approximately 1 to 3 μm thick x-ray sensitive photoresist layer 2 is applied, as shown in FIG. 5A, to implement the process of FIGS. 1 and 2. In the next process step, as shown in FIG. 5B, suitably shaped areas of the heavy-metal layer 3, in between which the alignment marks 9 are located on the surface of semiconductor wafer 1, are, for example, vapor deposited in the areas 8 to be provided with semiconductor circuits, using a mask 10 illustrated in FIG. 6, which is provided with corresponding recesses 11. Subsequently, this assembly is coated with the electron beam sensitive photoresist layer 4, and through mask 20, FIG. 7, provided with recesses 21, the latter layer is exposed on the faces located in the areas of layer 3 applied in the preceding process step. As a result of the subsequent development, the areas 21 of semiconductor wafer 1, which are defined by mask 20, are bared, so that alignment of the masks, not shown, used to expose the residual areas of the electron beam sensitive photoresist layer 4 can be effected with the aid of the alignment marks 9 and electron beam operated alignment means, not shown, at an accuracy corresponding to the resolution of electron beam exposure. This shows that no exacting requirements have to be met with regard to the positional accuracy of the residual areas 8 of layers 2, 3 and 4, as the alignment marks 9 occupy only a fraction of the areas defined by the recesses 16 and are arranged roughly in their center. Thus, the requirements to be met with regard to the residual areas of layers 2, 3, and 4 are relatively slight; the admissible tolerances amounting, as a rule, to ±30 μm. It is pointed out that in the figures the thicknesses of the individual layers as well as the interposed areas 16 and the alignment marks 9 are considerably enlarged for clarity's and simplicity's sake.

It will be seen that after extremely exact alignment with the aid of the alignment marks 9, the residual areas, FIG. 5D, of the electron beam sensitive photoresist layer 4 can be individually exposed at high accuracy by means of methods known pe se. As areas 8 of heavy-metal layer 3, which represent x-ray masks after development of the exposed layer 4 and a subsequent etching step, are permanently connected to the semiconductor wafer 1 via the only about 1 to 3 μm thick x-ray sensitive layer 2, changes in distance and the lateral relative position between the heavy-metal layer 3, serving as a mask, and the surface of the semiconductor wafer 1 are precluded during the introduction of the semiconductor wafer into the x-ray exposure system as well as during exposure. Because of the very small and constant spacing between layer 3 and semiconductor wafer 1 and because of the unchanged relative position of both layers, large area and thus high-energy x-ray sources can be arranged at relatively short distances from the layers to be exposed. Therefore, the x-ray intensities available in the area of the semiconductor wafer can exceed by powers of ten those of any previously known x-ray exposure systems, and the process in accordance with the invention permits exposing within a few minutes a great number of semiconductor wafers with several hundred chips each. As the exposure of the residual areas of the electron beam sensitive layer 4 and the alignment of the patterns to be applied to areas 8 can be effected with the aid of known, highly accurate and highly efficient alignment methods, and the subsequent process step in which some ten thousand chips are simultaneously exposed requires only several minutes, the time necessary for exposing a predetermined number of chips is considerably reduced by the process described. It is even more significant that the described process permits the transfer of extremely finely structured and extremely accurately aligned patterns, for which previously known electron beam and x-ray exposure processes were unsuitable. In comparison with previously known x-ray exposure processes, which could be used only in connection with single-layer lithography, for example, for manufacturing magnetic bubble storages, the described process can be used to produce integrated semiconductor circuits in the submicron range with a random number of superimposed patterns, without overlay errors being encountered.

Having thus described my invention, what we claim as new and desire to secure by Letters Patent is:

1. A process for x-ray exposing a radiation sensitive layer comprising the following steps:
    (a) applying a first, x-ray sensitive layer to a semiconductor wafer, used for the manufacture of a plurality of integrated circuits, on which are provided alignment marks between the individual surface areas destined to accomodate said integrated circuits,
    (b) applying a second, superimposed x-ray absorbing metal layer only to the individual surface areas destined to accomodate said integrated circuits,
    (c) applying a third, superimposed electron beam sensitive layer,
    (d) removing the areas of the x-ray sensitive layer and the electron beam sensitive layer over the alignment marks by exposure and development to bare the alignment marks,
    (e) electron beam exposing the third layer in the form of a pattern defining the areas of the first layer which are to be x-ray exposed after alignment of the individual surface areas using electron beams and said alignment masks,
    (f) removing the exposed areas of the third layer by development,
    (g) removing the bared areas of the second layer by etching, and
    (h) exposing the first layer to x-rays through the opening in the second layer which serves as a mask.

2. The process in accordance with claim 1, in which the x-ray absorbing layer is a heavy-metal layer.

3. The process in accordance with claim 1 in which the first, x-ray sensitive layer is a 1 to 10 μm thick photoresist layer.

4. The process in accordance with claim 1 in which the x-ray absorbing layer is 0.1 to 0.5 μm thick.

5. The process in accordance with claim 1 in which the third, x-ray sensitive layer is a 0.1 to 0.5 μm thick photoresist layer.

6. The process in accordance with claim 1 in which the third, electron beam sensitive layer is removed prior to x-ray exposure.

7. The process in accordance with claim 1 in which the first and third layers are applied by spinning, with the deviations from the nominal thickness being less than ±10%.

8. The process in accordance with claim 1 in which the x-ray absorbing layer is applied by vapor deposition through a mask.

9. The process in accordance with claim 1 in which exposure of the electron beam sensitive layer is effected by means of a computer-controlled electron beam line recorder.

10. The process in accordance with claim 9 in which exposure of the electron beam sensitive layer is effected at low beam acceleration voltages of 1 to 10 KV, the electron beams not penetrating or penetrating only a small part of the second layer.

* * * * *